United States Patent
Kanga

(10) Patent No.: US 6,989,220 B2
(45) Date of Patent: *Jan. 24, 2006

(54) PROCESSLESS DIGITALLY IMAGED PHOTOPOLYMER ELEMENTS USING MICROSPHERES

(75) Inventor: Rustom Sam Kanga, Marietta, GA (US)

(73) Assignee: MacDermid Printing Solutions, LLC, Waterbury, CT (US)

(*) Notice: Subject to any disclaimer, the term of this patent is extended or adjusted under 35 U.S.C. 154(b) by 0 days.

This patent is subject to a terminal disclaimer.

(21) Appl. No.: 10/768,799

(22) Filed: Jan. 30, 2004

(65) Prior Publication Data

US 2004/0241583 A1 Dec. 2, 2004

Related U.S. Application Data

(63) Continuation-in-part of application No. 10/105,898, filed on Mar. 25, 2002, now Pat. No. 6,806,018.

(51) Int. Cl.
- G03F 7/032 (2006.01)
- G03F 7/039 (2006.01)
- G03F 7/11 (2006.01)
- G03F 7/38 (2006.01)
- G03F 7/26 (2006.01)

(52) U.S. Cl. ............ 430/14; 430/17; 430/18; 430/138; 430/270.1; 430/271.1; 430/273.1; 430/306; 430/330; 430/964

(58) Field of Classification Search ........ 430/14, 430/17, 18, 138, 330, 270.1, 271.1, 273.1, 430/964, 306
See application file for complete search history.

(56) References Cited

U.S. PATENT DOCUMENTS

| | | | |
|---|---|---|---|
| 4,045,231 A | 8/1977 | Toda et al. |
| 4,177,074 A | 12/1979 | Proskow |
| 4,427,759 A | 1/1984 | Gruetzmacher et al. |
| 4,460,675 A | 7/1984 | Gruetzmacher et al. |
| 4,517,279 A | 5/1985 | Worns |
| 4,622,088 A | 11/1986 | Min |
| 4,758,500 A | 7/1988 | Schober et al. |
| 4,771,079 A | 9/1988 | Melber |
| 4,871,650 A | 10/1989 | Wallbillich et al. |
| 5,223,375 A | 6/1993 | Berrier et al. |
| 5,364,683 A | 11/1994 | Flint et al. |
| 5,364,741 A | 11/1994 | Huynh-Tran et al. |
| 5,798,019 A | 8/1998 | Cushner et al. |
| 5,916,403 A | 6/1999 | Cushner et al. |
| 5,925,500 A | 7/1999 | Yang et al. |
| 5,976,765 A | 11/1999 | Kumpfmiller et al. |

(Continued)

FOREIGN PATENT DOCUMENTS

DE 2844426 9/1979

(Continued)

*Primary Examiner*—Richard L. Schilling
(74) *Attorney, Agent, or Firm*—Carmody & Torrance LLP

(57) ABSTRACT

Laser imageable flexographic printing elements, including printing plates and printing sleeves and methods of making the laser imageable flexographic printing elements using a collapsible cross-linkable material comprising a curable elastomer, a material that absorbs laser radiation at a selected wavelength, and microspheres are disclosed. A laser is used to collapse and melt the collapsible cross-linkable material to form a relief image on the printing element. The printing element is thereafter cured by face exposure to crosslink and cure the formed relief image. The invention addresses a market need for eliminating chemical processing of printing elements, thus going from printing element to press much more quickly and using an environmentally friendly process.

113 Claims, 4 Drawing Sheets

"Thermofoam" Plate Concept

1. Raw UV curable plate material, with IR sensitive microspheres.
2. IR Laser "collapsing" microspheres to create relief.
3. UV post cure to toughen plate for press usage.

U.S. PATENT DOCUMENTS

| | | | |
|---|---|---|---|
| 6,017,679 A | 1/2000 | Chase et al. | |
| 6,071,567 A | 6/2000 | Castelli et al. | |
| 6,090,529 A | 7/2000 | Gelbart | |
| 6,124,370 A | 9/2000 | Walton et al. | |
| 6,159,659 A | 12/2000 | Gelbart | |
| 6,171,758 B1 | 1/2001 | Bhateja et al. | |
| 6,287,638 B1 | 9/2001 | Castelli et al. | |
| 6,425,327 B1 | 7/2002 | Fan et al. | |
| 6,551,759 B2 | 4/2003 | Daems et al. | |
| 6,806,018 B2 * | 10/2004 | Kanga et al. | 430/138 |
| 2003/0054153 A1 | 3/2003 | Kuczynski et al. | |

FOREIGN PATENT DOCUMENTS

| | | |
|---|---|---|
| EP | 0 107 608 A1 | 5/1984 |
| EP | 0 184 598 A1 | 6/1986 |
| EP | 0 280 103 B1 | 4/1991 |
| EP | 0 726 290 B1 | 8/1996 |
| EP | 0 852 596 B1 | 7/1998 |
| EP | 0 982 124 A2 | 8/1999 |
| GB | 1 879 817 | 11/1980 |
| WO | WO 01/18604 A2 | 3/2001 |
| WO | WO 01/88615 A1 | 11/2001 |

* cited by examiner

STAGE 2

PROCESSLESS DIGITALLY IMAGED PHOTOPOLYMER ELEMENTS USING MICROSPHERES

CROSS REFERENCE TO RELATED APPLICATIONS

This application is a continuation-in-part of application Ser. No. 10/105,898, filed on Mar. 25, 2002, now U.S. Pat. No. 6,806,018, the subject matter of which is herein incorporated by reference.

FIELD OF THE INVENTION

The present invention relates to photosensitive elastomeric compositions used to prepare digitally imaged photopolymer printing elements, such as printing plates and printing sleeves, without the need for any interim process steps.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only be means of flexography. Flexographic printing plates are relief plates with image elements raised above open areas. Such plates offer a number of advantages to the printer, based chiefly on their durability and the ease with which they can be made.

Although photopolymer printing elements are typically used in "flat" sheet form, there are particular applications and advantages to using the printing element in a continuous cylindrical form, as a Continuous In-The-Round (CITR) photopolymer sleeve. CITR photopolymer sleeves add the benefits of digital imaging, accurate registration, fast mounting, and no plate lift to the flexo printing process. CITR sleeves have applications in the flexographic printing of continuous designs such as in wallpaper, decoration and gift-wrapping paper, and other continuous designs such as tablecloths, etc. Thus, CITR sleeves enable flexo printing to be more competitive with gravure and offset on print quality.

A typical flexographic printing plate as delivered by its manufacturer, is a multilayered article made of, in order, a backing or support layer, one or more unexposed photocurable layers, a protective layer or slip film, and a cover sheet. A typical CITR photopolymer sleeve generally comprises a sleeve carrier (support layer) and at least one unexposed photocurable layer on top of the support layer.

The backing layer lends support to the printing element. It is typically a plastic film or sheet about 5 mils or so thick, and may be transparent or opaque. Polyester films, such as polyethylene terephthalate film, can suitably be used as the backing. In the case of printing sleeves, metals, such as nickel and steel, or polymer/fiber composite materials, may also be usable as the backing layer.

When only a single photocurable layer is present, it may be anywhere from about 25 to about 275 mils thick, and can be formulated from any of a wide variety of known photopolymers, initiators, reactive diluents, etc. In some printing elements, there is a second photocurable layer (referred to as an "overcoat" or "printing" layer) atop this first, base layer of photocurable material. This second layer usually has a similar composition to the first layer, but is generally much thinner, being on the order of less than about 10 mils thick. The slip film is a thin (approximately 0.1–1.0 mils) sheet, which is transparent to UV light, and which protects the photopolymer from dust and increases its ease of handling. The cover sheet is a heavy, protective layer, typically polyester, plastic, or paper.

Typical prior art methods for making flexographic printing plates may be found, for example, in U.S. Pat. Nos. 4,045,231, 5,223,375 and 5,925,500, the teachings of which are incorporated by reference herein in their entirety. Typical prior art methods for making printing sleeves may be found, for example, in U.S. Pat. Nos. 4,871,650, 5,798,019, 5,916,403, and 6,424,327, the teachings of which are herein incorporated by reference in their entirety.

It is highly desirable in the flexographic prepress printing industry to eliminate the need for chemical processing of printing elements in developing relief images, in order to go from plate to press more quickly. An early attempt to reduce solvents, and the inherently longer drying required for solvent developing was the aqueous developable flexographic printing plate, as taught in U.S. Pat. Nos. 4,177,074, 4,517,279, 5,364,741 and 6,017,679, the teachings of which are herein incorporated by reference in their entirety. However, the use of water to develop relief is still a "processing" step. In addition, water-developable printing plates have inherent disadvantages, such as limited print performance and the generation of wastewater.

Thermal mass transfer plates, such as DuPont Cyrel® FAST™, are gaining popularity because they are chemical free. In the case of the FAST™ approach, the thermal process of removing the uncured non-image areas of the photopolymer is carried out after cross-linking the image areas of the plate. This approach is demonstrated in U.S. Pat. No. 6,171,758, and in Patent Nos. WO 0118604 and WO 0188615, the teachings of which are herein incorporated by reference in their entirety. Since the photopolymer is "dense", removing of the uncured non-image areas takes a substantial amount of time to achieve. Customers must also invest in a special and additional proprietary thermal processor.

Laser-engraving systems from Fulflex and BASF (called LEP) are also process-free. An example of this technology is found in Patent No. EP 0 982 124 A2, the teachings of which are herein incorporated by reference in their entirety. In the BASF and ZED/Fulflex approach, the photopolymer/rubber is cured or cross-linked prior to the engraving step. Once again, because of the high density of these materials, the thermal engraving step is long and tedious. Additionally, high resolution is difficult to achieve. Thus, the disadvantage of prior art engraved plates is a combination of limited resolution and throughput.

Directly engraving a relief-printing element with a laser is a highly desirable concept. However, $CO_2$ engraving lasers lack beam resolution and cause anomalies due to heat dissipation. The resolution of such systems is limited to well below 133 lines per inch (LPI) on a practical basis. Infrared (IR) lasers such as Nd-YAG lasers are extremely high in resolution and are precisely controlled. However, these lasers lack the necessary power and reactivity to engrave conventional photopolymers and may be too slow due to mass transfer limitations in dense "cured" photopolymer or rubber systems.

Digitally imaged continuous photopolymer sleeves add the benefits of digital imaging, accurate registration, fast mounting, and no plate lift to the flexo printing process. In addition, digital sleeve printing with CITR enables converters to save money on a total cost basis when compared to flat flexo plates due to the elimination of plate mounting in addition to significant efficiency gains once on press. Furthermore, such continuous printing elements can be well suited for mounting on laser exposure plate-setters.

CITR photopolymer sleeve products with limited performance have been available to the market for many years. Trade shops, using mostly traditional photopolymer and sleeve raw materials in a complex manufacturing process with long lead times, currently produce these sleeves. The formation of "seamless," continuous photopolymer sleeve has traditionally been accomplished by a process called "Seamex". The Seamex process involves wrapping a layer of flat sheet elements, called "sleeve gum" (for example KOR® SG supplied by MacDermid Printing Solutions), to a nickel sleeve having a heat-activated primer coat to bond with the material so that the ends of the plate are joined together. The entire assembly is placed in an oven to cure and bond the photopolymer layer to the primer coat and melt the ends of the layer together. The photopolymer layer on the sleeve is ground to the necessary thickness, and then spray coated or ring coated with an IR sensitive layer. The process of wrapping, curing, melting, grinding and spraying the photopolymer layer to the sleeve can take about 1.5 to 2 days to accomplish. The cylindrical sleeve is then imaged on typical plate-setters, and the image set by exposure to UV light, and processed to wash away the unexposed areas of the layer on the cylinder, forming a relief surface for printing. These processes for joining the edges of a plate into a cylindrical form have been disclosed, for example, in U.S. Pat. No. 4,758,500, Great Britain Patent No. GB 1,579,817, German Patent No. DE 28 44 426, and European Patent No. EP 0 280 103, the subject matter of each of which is herein incorporated by reference in its entirety.

A problem with the prior methods of joining the edges to form a continuous cylinder is that sometimes the joined seam is visible in and interrupts the printed image. Moreover, image degradation may occur due to repeated exposure to heat, first in the extrusion and then during the "heat curing" process. It would be desirable to have a processless digitally imaged continuous sleeve option in the market, having the advantages of processless digital imaging described above and usable with CITR photopolymer sleeves.

A solution to the problems seen in prior art printing plates and printing sleeves may lie in the use of a curable thermoplastic elastomer that contains micro-bubbles to form a "processless" printing element. Preferably the elastomer is radiation-curable and the radiation source is selected from UV lights and Electron Beam (EB) sources. The inventor has surprisingly discovered that EB curing may be superior to UV curing for this application for reasons discussed in more detail below The use of EB curing is well-known in the prior art as evidenced by the teachings in U.S. patent application Ser. No. 2003/0054153 A1, EP A 84-18 0107608, EP A 86-25 0184598, EP B1 00852596, EP B 02-19 0726290, and U.S. Pat. No. 6,124,370, the teachings of each of which is herein incorporated by reference in its entirety.

The curable composition is essentially a photocurable elastomeric uncured foam that is laden with a material that absorbs light at a selected wavelength. In a preferred embodiment, this material is a dye (or pigment) that is both IR absorbing and UV transmissive. As the IR laser strikes the material that absorbs light at a selected wavelength (i.e., dye), it transfers IR energy into heat, causing "laser collapse" of the micro-bubbles or microspheres. Because the photocurable elastomeric material consists of foam cells which are only microns in size, the ablation-to-depth process can occur much more quickly, using much lower energy than is required in true mass transfer systems such as mask ablation or polymer engraving. In addition, the lower density and the corresponding lower heat energies involved in this process act to prevent conductance of heat energy to adjoining cells, thus limiting thermal damage and having the potential for higher resolution than traditional laser engraving. After all of the non-printing (relief) areas have been laser collapsed, there may be an additional process step to laser collapse the top layer to form a denser printing surface. This denser printing surface can also be created by a "bump" laser-exposure in concert with the regular exposure. A "bump" or "flash" exposure refers to a quick exposure, generally of less than about 1 micro-second. The photopolymer is then flood exposed, preferably using UV- or EB-curing, to cross-link the formed image for enhanced physical properties. Finally, the process may contain a conventional detacking step.

The advantage of this "low density" approach is that it may be usable in any of the conventional plate-setters in the industry, with only a change in the software that is used to control the energy density; no major investment in hardware is needed. The disadvantage of UV-imaging through a "foam" is obviated because the imaging is done by the interaction of the IR laser with the microspheres. Curing is used simply to set the image in place. Furthermore, one avoids the washout process step, and hence has the workflow advantage of going from plate to press much more quickly than in conventional flexographic printing elements, while at the same time reducing solid waste generation.

U.S. Pat. No. 6,159,659 and U.S. Pat. No. 6,090,529, both to Gelbart, the teachings of which are incorporated herein by reference in their entirety, disclose methods for directly creating a raised image on a flexographic printing surface. These patents disclose laser ablation of an intermediate layer that comprises an elastomer and a high concentration of plastic or glass microballoons, in order to form recessed areas on the surface. In addition, these patents disclose controlling the intensity of a laser beam and the dwell time of the laser beam in each spot so that the laser power applied to each part of the surface is sufficient to cause localized melting of the intermediate layer. The dwell time is sufficiently long so as to produce viscous flow of the melted material, while the laser intensity is insufficient to cause complete ablation of the intermediate layer. In one example, the printing plate is made from a closed-cell black polyurethane foam, where the foam has a density of about 10% that of solid polyurethane. U.S. Pat. No. 6,159,659 further discloses that when the plate is "cut" or ablated, with a laser at the operating wavelength, the cutting action is self-limiting because of the insensitivity of the backing at the operating wavelength, which avoids damage to the backing.

The present invention comprises a collapsible photosensitive elastomer composition comprising a curable elastomer, a material that absorbs laser light at a selected wavelength, and microspheres used for making digitally imageable relief-printing elements. In contrast, the U.S. Pat. No. 6,090,529 patent and the U.S. Pat. No. 6,159,659 patent do not disclose a photosensitive elastomer and do not disclose crosslinking the composition of the formed image in order to enhance the physical properties of the printing element. In addition, the U.S. Pat. No. 6,090,529 patent and the U.S. Pat. No. 6,159,659 patent do not disclose how the foam intermediate layer behaves as a printing plate. The patents disclose a pigment/dye that is carbon-based, which is not suitable for use in the present invention because it would interfere with the photocurable aspects of the invention.

The present invention also describes a cross-linkable raw material that is cured after laser imaging for added physical strength necessary for press life durability. The present invention advocates the use of microspheres, to yield excellent image fidelity and consistency. As explained in more detail below, the choice of the microspheres and the material that absorbs laser light at a selected wavelength are key elements to the success of this invention.

The new concept of the present invention addresses the market need for eliminating the need for chemical processing of printing elements, by using a very low-density photopolymer printing element that is impregnated with infrared (IR) sensitive micro-bubbles, that collapse when irradiated with a laser. Subsequently the photopolymer can be cured to cross-link the material to enhance its physical properties.

SUMMARY OF THE INVENTION

It is an object of the present invention to provide a printing element comprising a collapsible curable elastomer composition comprising a curable elastomer, a material that absorbs laser light at a selected wavelength, and microspheres.

Another aspect of the invention is to provide a method of making a laser imageable printing element using a collapsible cross-linkable material that comprises microspheres, so as to decrease the final density of the photopolymer formulation and to provide for a method that does not require the use of any interim process steps.

The objects of the invention can be accomplished by providing digitally imaged relief printing elements and methods of making the digitally imaged relief-printing elements.

In one embodiment, the invention comprises a digitally imageable relief-printing plate and a method of making the digitally imageable relief-printing plate comprising the steps of:
 a) providing a collapsible curable layer comprising (i) a curable elastomer, (ii) a material that absorbs light at a selected wavelength, and (iii) microspheres, between a coversheet and a backing sheet to form a printing plate;
 b) exposing the collapsible curable layer through the backing sheet to establish a floor layer;
 c) removing the coversheet from the printing plate;
 d) using a laser to collapse and melt portions of the collapsible curable layer to form a relief image on the printing plate; and
 e) curing the collapsible curable layer by face exposure to crosslink and cure the formed relief image.

In another embodiment, the printing plate further comprises a cap layer comprising a thin layer a non-collapsible curable elastomer positioned between the collapsible curable layer and the cover sheet of the printing plate.

The invention also comprises a method of making a digitally imageable relief-printing sleeve comprising the steps of:
 a) providing a first collapsible curable layer comprising (i) a curable elastomer, (ii) a material that absorbs laser light at a selected wavelength, and (iii) microspheres, onto a carrier or backing layer;
 b) completely curing the first collapsible layer to establish a floor layer;
 c) providing a second collapsible radiation-curable layer on top of the cured floor layer;
 d) providing a cap layer comprising a non-collapsible curable elastomer layer on top of the second collapsible curable layer;
 e) using a laser to collapse and melt portions of the underlying collapsible curable elastomer to form a relief image on the printing element with the non-collapsible cap layer acting as the printing surface; and
 f) curing said first and second curable elastomer layers by face exposure to cross link said formed relief image.

In another embodiment, the invention comprises a method of making a digitally imageable relief-printing sleeve comprising the steps of:
 a) extruding a collapsible curable elastomer composition comprising (i) a curable elastomer, (ii) a material that absorbs laser light at a selected wavelength of the laser, and (iii) microspheres, onto a transparent sleeve carrier;
 b) extruding a cap layer comprising a non-collapsible radiation-curable elastomer layer on top of the collapsible radiation-curable layer;
 c) back exposing through the sleeve carrier to establish a floor layer;
 d) using a laser to collapse and melt portions of the collapsible radiation-curable elastomer to form a relief image on the printing sleeve; and
 e) curing said curable elastomer by face exposure to crosslink said formed relief image.

If necessary, the printing elements of the invention may also be post-cured and detacked.

Expanded and unexpanded microspheres are usable in the collapsible elastomer compositions of the invention. When unexpanded microspheres are used, they are subsequently expanded using a baking step.

Additional features and advantages of the present invention will become apparent through the disclosure described below.

DETAILED DESCRIPTION OF THE PREFERRED EMBODIMENTS OF THE INVENTION

Figure 1:
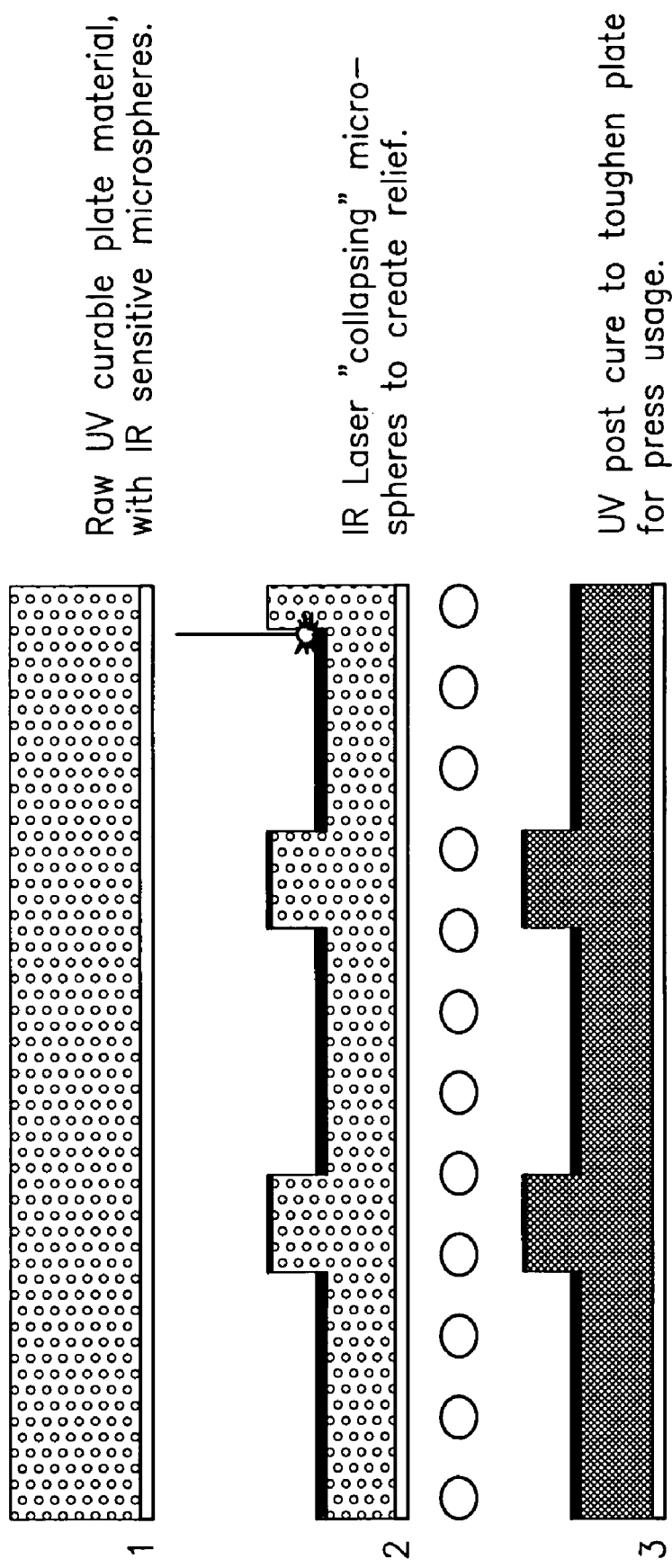
FIG. 1 depicts a view of one embodiment of a digitally imageable printing plate of the invention.

The present invention describes methods of making laser-imageable printing elements, including printing plates and printing sleeves without the need for chemical processing of the printing element.

Printing Plate Construction

The printing plate of the invention generally comprises, from the top, a polyethylene terephthalate coversheet with a release coating or a slip film coating, a collapsible curable elastomer layer and a polyethylene terephthalate backing. Depending on the application, other plate constructions may also be employed.

The collapsible curable elastomer composition is formed by mixing a curable elastomer, a material that absorbs laser light at a selected wavelength of the laser, and microspheres. The collapsible curable elastomer composition is then extruded between a cover sheet and a backing sheet to form a printing plate. The cover sheet may optionally contain a release agent to facilitate the easy removal of the coversheet for mounting onto the plate setter.

The collapsible curable elastomer composition is back exposed through the backing sheet to establish a floor layer. This "back exposure" is a blanket exposure to actinic radiation through the support, and is used to create a shallow layer of polymerized material, or a "floor," on the support side of the photopolymerizable layer. The floor provides improved adhesion between the photopolymerizable layer and the support and establishes the depth of the plate relief.

The cover sheet is then removed from the printing plate and the printing plate is mounted on a plate setter. A digital file is transferred from a computer onto the printing plate. A laser, preferably an infrared laser operating at a wavelength of 830 nm or 1064 nm, is used to collapse and melt the curable elastomer to form a relief image on the printing plate. The curable elastomer is then face exposed to crosslink and cure the formed image. In general, most flexographic printing plates are uniformly face exposed to ensure that the photopolymerization process is complete and that the plate will remain stable during printing and storage.

Finally, the plate may be subjected to an optional detacking step. Detackification is an optional post-development treatment that can be utilized if the surface is still tacky. Tackiness can be eliminated by any methods known in the art.

After the face exposure and optional detacking steps, the plate is ready for printing on the press. The plate is cured and post-cured to hold 1% dots at 133 lines per inch (LPI). LPI is a measure of screen frequency in flexography, where the higher the frequency, the finer the print. Thus, rough printing, such as on corrugated cardboard, typically uses a line screen of about 65 LPI, and finer printing, such as on tags or labels and packaging generally uses much higher line screens, such as 120 LPI and higher.

The choice of the microspheres governs the manufacturing method, while the choice of the material that absorbs laser light at a selected wavelength governs the operating wavelength of the plate-setter.

The method may include a further step of creating a denser printing layer on the surface of the flexographic printing plate. This denser printing layer may be built into the plate construction for example by adding a thin layer of a non-collapsible UV-curable elastomer or a "cap" between the collapsible layer and the plate surface. This denser non-collapsible layer may have a similar or the same composition as the collapsible layer, but without the addition of the microspheres. The non-collapsible layer may also be similar to or the same as typical cap layers normally used in conventional capped plates, such as MacDermid's Flexlight® EPIC. Examples of the cap layer are well known in the art and may be found, for example, in U.S. Pat. Nos. 4,427,759, 4,460,675, and 5,976,765, the subject matter of each of which is herein incorporated by reference in its entirety.

In the alternative, the method may include a step of laser collapsing a top layer of the formed image to form a denser printing surface. This step may occur simultaneously with the formation of the relief image by bump exposure, or may alternatively occur in a separate step immediately after formation of the relief image.

FIG. 1 depicts several stages in the manufacture of the printing plate of the present invention. The first stage (1) shows a raw printing plate, comprising a collapsible UV-curable elastomer layer that contains a UV-curable elastomer, an IR dye, and microspheres; the second stage (2) shows the IR laser collapsing the microspheres contained in the collapsible UV-curable elastomer layer to create the relief image of the printing plate; and the third stage (3) demonstrates the UV curing and post-curing steps that toughen the printing plate for press usage.

Printing Sleeve Construction

Printing sleeves of the invention are generally constructed in the following manner:
1) forming at least one collapsible curable layer on a sleeve carrier;
2) forming a cap layer of a non-collapsible curable elastomer on the at least one collapsible curable layer;
3) using a laser to collapse and melt portions of the collapsible radiation-curable layer to forming a relief image on the printing sleeve with the cap layer acting as the printing surface; and
4) curing the elastomer layers by face exposure to crosslink the formed relief image.

The cap layer is preferably extruded 5–10 mils over-gage and further ground to a desired gage to form a seamless structure having a smooth printing surface. The grinding is accomplished, for example, by using a grinder with a stone or a sander. In general, the required gage of the cap layer is about 2–10 mils.

In one embodiment of the invention, the printing sleeve contains two collapsible curable layers and the first collapsible layer is completely cured through the top to establish a floor layer prior to the second collapsible curable layer being formed on top of the formed floor layer. The floor layer can also function as a "compressible" layer. If desired, the second collapsible curable layer and the cap layer can be formed simultaneously, for example, by co-extrusion.

After the first collapsible layer is completely cured to establish a floor layer, the resulting floor layer is preferably ground to a desired gage. The thickness of the floor layer may range from about 5 mils to about 134 mils depending on the printing application and the substrate.

In another embodiment of the invention, the printing sleeve contains only one collapsible radiation-curable layer and a cap layer. In this instance, the sleeve carrier is transparent and the printing sleeve is back exposed through the sleeve carrier to establish the floor layer. Again, if desired, the collapsible curable layer and the cap layer can be co-extruded.

Curing of the elastomer layers is accomplished by thermal curing or radiation curing; radiation curing is generally preferred. Sources of radiation that may be used to cure the elastomer layers include UV-light and electron beams, although other sources of radiation would also be known to those skilled in the art. If necessary, printing sleeves of the invention may be post-cured and detacked.

Figure 2:
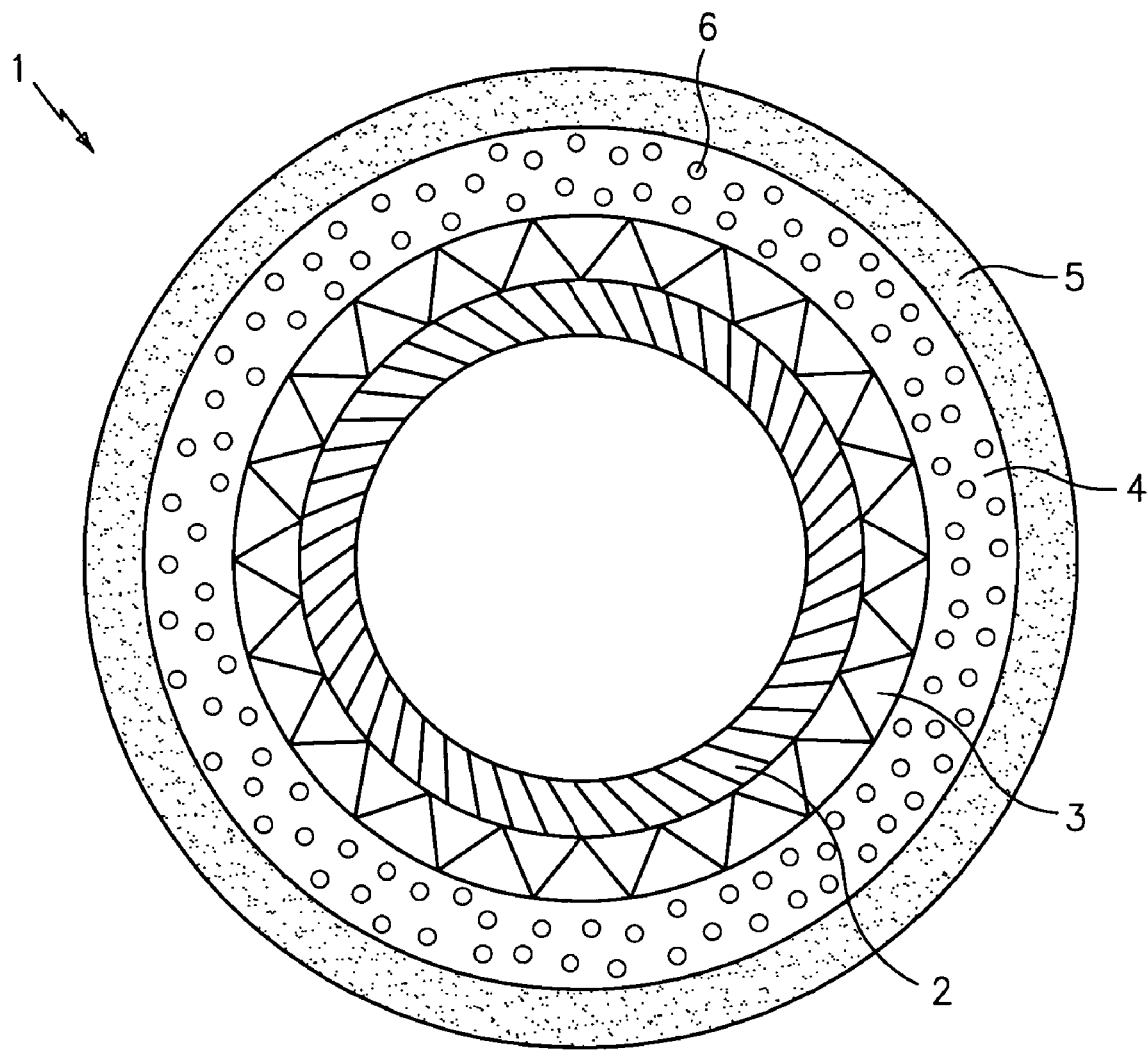
FIG. 2 depicts a cross-sectional view of one embodiment of a digitally imageable printing sleeve of the invention.
Figure 3:
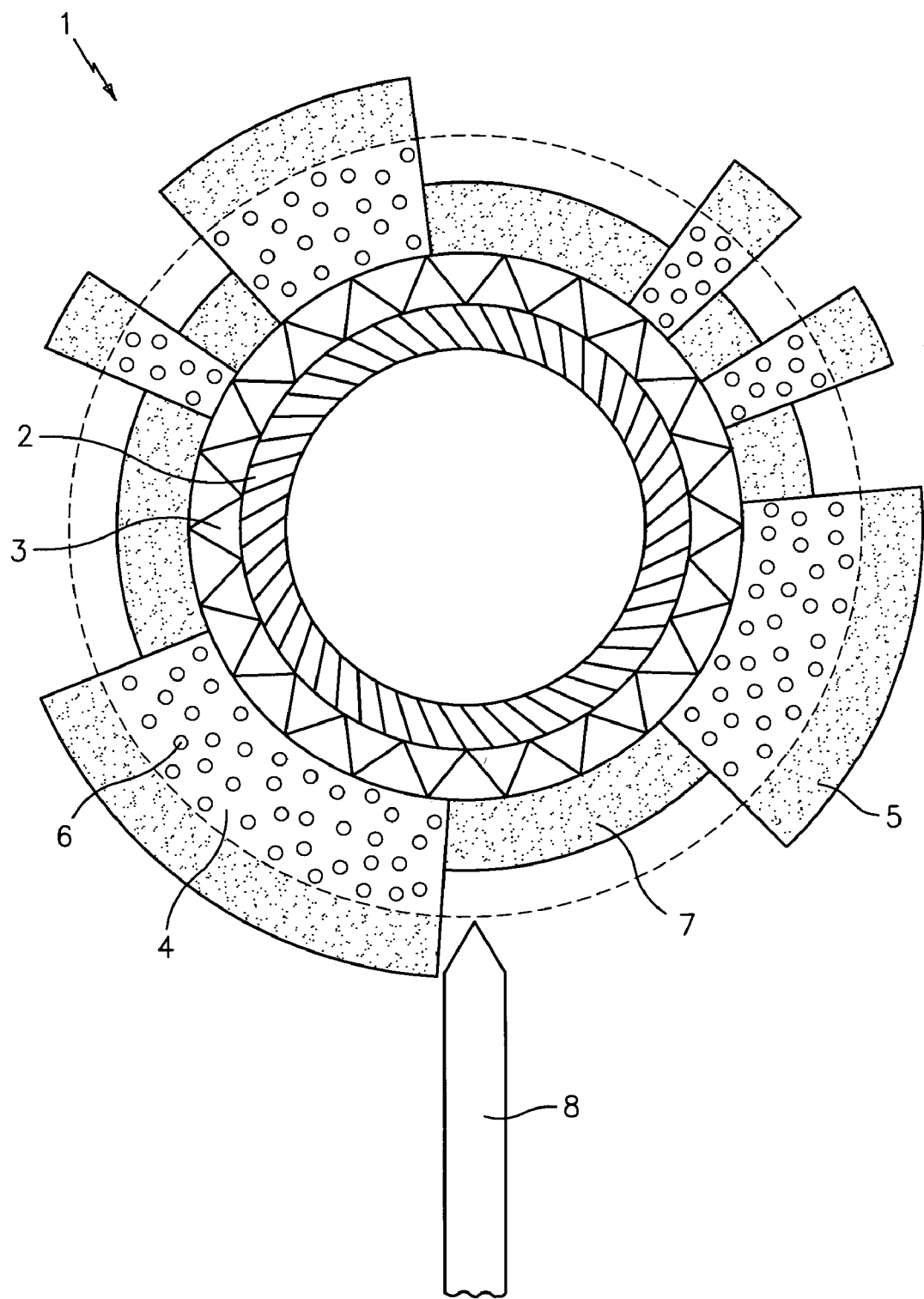
FIG. 3 depicts a cross-sectional view of the same embodiment of the digitally imageable printing sleeve of the invention as the relief image is formed on the surface of the printing sleeve using a laser.
Figure 4:
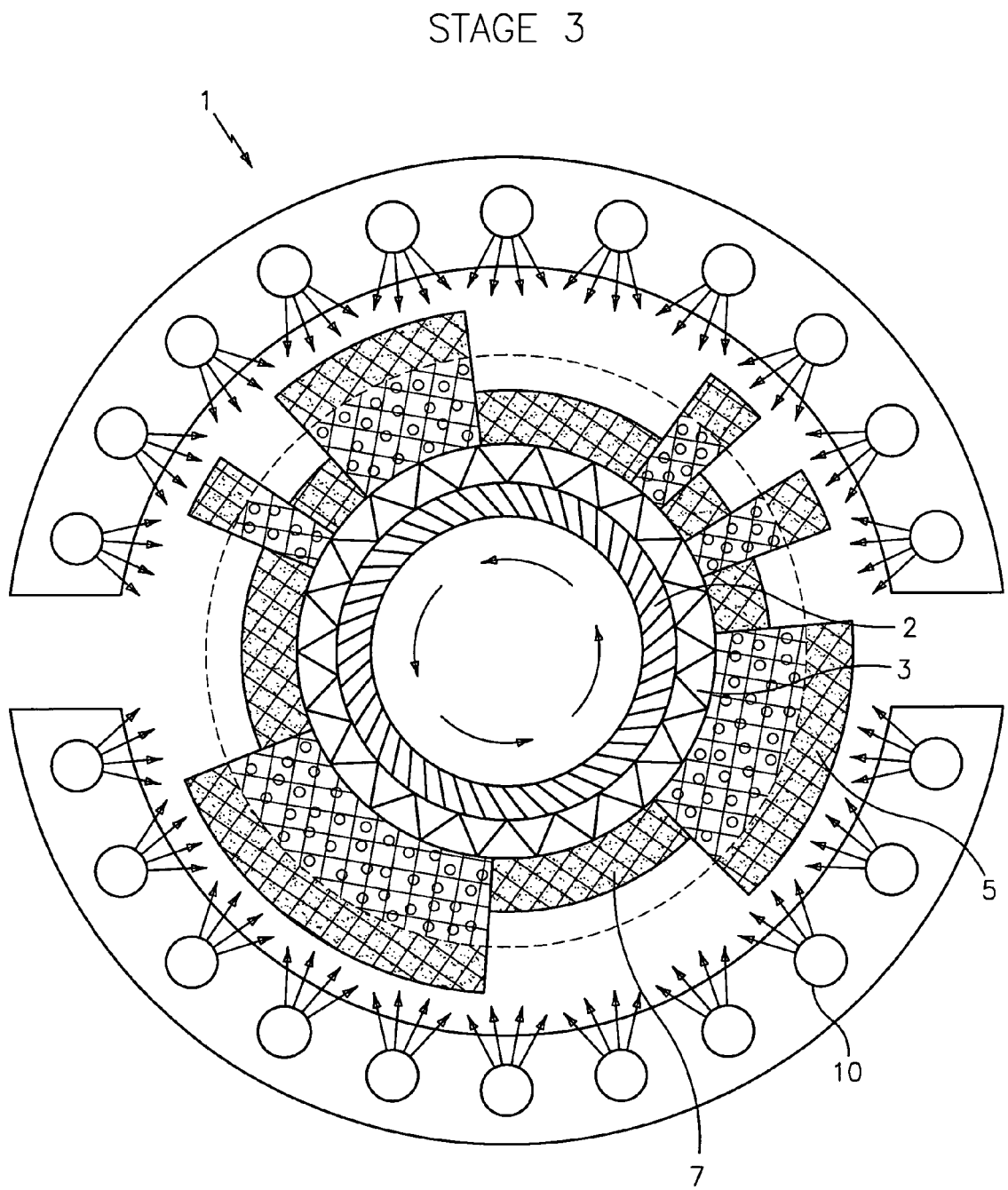
FIG. 4 depicts a cross-sectional view of the same embodiment of the digitally imageable printing sleeve of the invention as it is subjected to curing to crosslink the formed image.

FIGS. 2–4 depict several stages in the manufacture of a printing sleeve of the present invention.

FIG. 2 shows a cross-sectional view of a typical raw laser-imageable printing sleeve of the invention, i.e., before the plate is subjected to laser imaging. As seen in FIG. 2, the printing sleeve (1) typically is constructed of a sleeve carrier (2), a floor layer (3), a collapsible relief layer (4) and a non-collapsible radiation-curable cap layer (5).

The sleeve carrier or support (2) can be constructed of any material or composite, which provides the desired rigidity and thermal stability. Typically, materials for construction of the sleeve carrier (2) include metals, such as steel, aluminum, and nickel, polymers, and polymer/fiber composites, such as carbon-fiber or fiberglass reinforced resins. Polymeric films, including polyethylene terephthalate (PET) and polystyrene and polyvinyl resins, are also usable as the sleeve carrier of the invention.

On top of the sleeve carrier (2) is a floor layer (3) that provides support to the printing sleeve and is formed from a collapsible or non-collapsible photopolymer composition. The method of creating the floor layer (3) on the sleeve carrier (2) depends on whether the sleeve carrier (2) is transparent or opaque. If a transparent sleeve carrier such as PET is used, the floor layer can be created by back exposure through the sleeve carrier (2). If a more opaque sleeve carrier (2) is used, the floor layer is created by front exposure.

On top of the floor layer (3) are one or more collapsible relief layers (4), formed from a collapsible radiation-curable photopolymer composition. The collapsible curable relief layer(s) (4) of the invention generally comprise (i) a curable elastomer; (ii) a material that absorbs laser light at a selected wavelength; and (iii) expanded or unexpanded microspheres (6).

Finally, the printing sleeve (1) of the invention comprises a non-collapsible radiation-curable cap layer (5) on top of the collapsible relief layer (4) that acts as the printing surface in the final sleeve formulation. This denser non-collapsible layer may have a similar or the same composition as the collapsible layer, but without the addition of the microspheres. The non-collapsible layer (5) may also be similar to or the same as typical cap layers normally used in conventional capped plates, such as MacDermid's Flexlight® EPIC. Examples of the cap layer are well known in the art and may be found, for example, in U.S. Pat. Nos. 4,427,759, 4,460,675, and 5,976,765, the subject matter of which is herein incorporated by reference in their entirety.

FIG. 3 shows the printing sleeve (1) of the invention as it is being subjected to an IR laser (8) to collapse the microspheres (6) contained in the collapsible radiation-curable elastomer layer (4) to create the relief image (7) of the printing sleeve (1).

FIG. 4 shows the printing sleeve (1) of the invention as it is subjected to radiation-curing and post-curing steps to toughen the printing sleeve for press usage. As discussed above, curing of the elastomer layers is accomplished by thermal curing or radiation curing using radiation source(s) (10). Sources of radiation (10) include UV light and electron beams.

Curable Elastomer

The curable elastomer of the invention comprises:
(1) a binder;
(2) a plasticizer;
(3) a photopackage, including curable monomers and photoinitiators; and
(4) other additives.

The binder lends structural stability to the plate. Suitable binders include styrene-butadiene-styrene copolymers, thermoplastic elastomers, thermoplastic polyurethanes, styrene-isoprene-styrene copolymers, and polyurethanes. Preferred binders include triblock copolymers of styrene-butadiene-styrene and styrene-isoprene styrene. Kraton™ D1102, a styrene-butadiene-styrene copolymer, and Kraton™ D1107, a styrene-isoprene-styrene copolymer, manufactured by Kraton Polymers are especially preferred.

Because the melt flow of the elastomer composition is crucial, it is imperative that the binder demonstrates reasonably high melt flow indices (MFI's). MFI's between about 5 g/10 minutes to about 20 g/10 minutes (200° C., 5 Kg) are preferred, and MFI's of about 10–11 g/10 minutes are more preferred. The lower limit is to facilitate the ease of laser collapse, while the upper limit in the MFI is for the strength and integrity of the final plate.

The function of the plasticizer is to create a medium in which the melted polymer has a reasonably low viscosity so that a viscous flow occurs during the laser collapse process. The plasticizer should be compatible with the binder, decrease the Shore A or durometer hardness, and decrease the viscosity of the melt at elevated temperatures, and at the same time should be able to interact with the binder so that it is non-tacky at ambient temperatures. Suitable plasticizers include oligomeric polyisoprenes and polybutadienes. One example of a plasticizer usable in the present invention is Shellflex™ 6371, a naphthenic/paraffinic oil specifically designed for rubber and plastics, manufactured by Shell Oil. The ratio of plasticizer to binder is critical to the success of the invention. If too much binder is used in the composition, the melt viscosity and Shore A hardness will be too high and unusable in the invention. Too much plasticizer will produce a weak composition.

The photopackage comprises typical curable monomers and photoinitiators. Difunctional and trifunctional monomers give good cross-link densities.

It has been found particularly advantageous to utilize Electron Beam (EB) curing in this application. The IR dye used in this composition, and shown below, does absorb some UV-actinic radiation and thus inhibits through-cure. Also, the microsphere-based foams taught in this application have a higher propensity to scatter and disperse UV actinic radiation, requiring longer times for through-cure. Thus, both the highly pigmented and microsphere-based foam compositions of this application may be advantageously cured using electron beam radiation. EB curing of curable compositions and particularly of foam compositions is well known in the art. See e.g., U.S. Patent Application No. 2003/0054153 A1, EP A 84-18 0107608, EP A 86-25 0184598, EP B1 00852596, EP B 02-19 0726290, and U.S. Pat. No. 6,124,370, the teachings of each of which is herein incorporated by reference in its entirety.

Some examples of difunctional and trifunctional monomers that are usable in the invention include acrylates such as trimethylolpropane triacrylate, hexanediol diacrylate (HDDA), 1,3-butylene glycol diacrylate, diethylene glycol diacrylate, 1,6-hexanediol diacrylate, neopentyl glycol diacrylate, polyethylene glycol-200 diacrylate, tetraethylene glycol diacrylate, triethylene glycol diacrylate, pentaerythritol tetraacrylate, tripropylene glycol diacrylate, ethoxylated bisphenol-A diacrylate, trimethylolpropane triacrylate, di-imethylolpropane tetraacrylate, triacylate of tris(hydroxyethyl) isocyanurate, dipentaerythritol hydroxypentaacrylate, pentaerythritol triacrylate, ethoxylated trimethylolpropane triacrylate, triethylene glycol dimethacrylate, ethylene glycol dimethacrylate, tetraethylene glycol dimethacrylate, polyethylene glycol-200 dimethacrylate, 1,6-hexanediol dimethacrylate, neopentyl glycol dimethacrylate, polyethylene glycol-600 dimethacrylate, 1,3-butylene glycol dimethacrylate, ethoxylated bisphenol-A dimethacrylate, trimethylolpropane trimethacrylate (TMPTMA), diethylene glycol dimethacrylate, 1,4-butanediol diacrylate, diethylene glycol dimethacrylate, pentaerythritol tetramethacrylate, glycerin dimethacrylate, trimethylolpropane dimethacrylate, pentaerythritol trimethacrylate, pentaerythritol dimethacrylate, pentaerythritol diacrylate, urethanemethacrylate or acrylate oligomers and the like which can be added to the photopolymerizable composition to modify the cured product. Monoacrylates such as cyclohexyl acrylate, isobornyl acrylate, lauryl acrylate and tetrahydrofurfuryl acrylate and the corresponding methacrylates are also operable as the radiation-curable monomer in the invention.

Photoinitiators for the radiation-curable elastomer composition include the benzoin alkyl ethers, such as benzoin methyl ether, benzoin ethyl ether, benzoin isopropyl ether and benzoin isobutyl ether. Another class of photoinitiators are the dialkoxyacetophenones, exemplified by 2,2-dimethoxy-2-phenylacetophenone, i.e., Irgacure® 651 (available from Ciba-Geigy, Hawthorne, N.Y.); and 2,2-diethoxy-2-phenylacetophenone. Still another class of photoinitiators are the aldehyde and ketone carbonyl compounds having at least one aromatic nucleus attached directly to the carboxyl group. These photoinitiators include, but are not limited to, benzophenone, acetophenone, o-methoxybenzophenone, acenaphthenequinone, methyl ethyl ketone, valerophenone, hexanophenone, alpha-phenylbutyrophenone, p-morpholinopropiophenone, dibenzosuberone, 4-morpholinobenzophenone, 4-morpholinodeoxybenzoin, p-diacetylbenzene, 4-aminobenzophenone, 4'-methoxyacetophenone, benzaldehyde, alpha-tetralone, 9-acetylphenanthrene, 2-acetylphenanthrene, 10-thioxanthenone, 3-acetylphenanthrene, 3-acetylindone, 9-fluorenone, 1-indanone, 1,3,5-triacetylbenzene, thioxanthen-9-one, xanthene-9-one, 7-H-benz[de]-anthracene-7-one, 1-naphthaldehyde, 4,4'-bis(dimethylamino)-benzophenone, fluorene-9-one, 1'-acetonaphthone, 2'-acetonaphthone, 2,3-butanedione, acetonaphthene, benz[a]anthracene 7.12 dione, etc. Phosphines such as triphenylphosphine and tri-o-tolylphosphine are also operable herein as photoinitiators. Benzophenone-based initiators are preferred. An example that is commercially available is Irgacure® 651.

To inhibit premature crosslinking during storage of the prepolymer containing compositions of this invention, thermal polymerization inhibitors and stabilizers may be added. Such stabilizers are well known in the art, and include, but are not limited to, hydroquinone monobenzyl ether, methyl hydroquinone, amyl quinone, amyloxyhydroquinone, n-butylphenol, phenol, hydroquinone monopropyl ether, phenothiazine and nitrobenzene, and mixtures thereof. These stabilizers are effective in preventing crosslinking of the prepolymer composition during preparation, processing and storage. Irganox® 1010, available from Ciba Specialty Chemicals, has been found to work well in the compositions of the instant invention.

Other additives that may be added to the elastomer to enhance the properties of the composition include extrusion aids and antioxidants. Suitable extrusion aids include calcium stearate. Suitable antioxidants include alkylated phenols, alkylated bisphenols, polymerized trimethyldihydroquinone, and dilauryl thiopropionate, may also be added. Beta-hydroxy toluene (BHT) is especially preferred.

UV light absorbers, or UV light stabilizers, may be added to the elastomer to adjust the photospeed and, therefore, exposure latitude of the elastomer material. Numerous materials will be apparent to those skilled in the art. Examples of light stabilizer classes usable in the compositions of the instant invention include hydroxy-benzophenones, 2-hydroxyphenyl benzotriazoles, hindered amines and organic nickel compounds. In addition, salicylates, cinnamate derivatives, resorcinol monobenzoates, oxanilides, and p-hydroxy benzoates may also be used. Tinuvin® 1130, a substituted hydroxphenyl benzotriazole, available from Ciba-Geigy Corp., has been found to work especially well.

Generally, any of the known photocurable compositions can be used in the present invention.

Microspheres

The choice of the microspheres is important to the success of the invention. The microspheres should be stable during the manufacturing process of the printing sleeve, yet able to collapse during the laser-imaging step. The microspheres should also be stable to solvents and monomers normally encountered in typical printing conditions. The size of the microspheres governs the "pixel" size.

For this application, there are at least two types of commercially available microspheres that may be used, unexpanded microspheres and expanded microspheres. While both types are usable in the invention, the unexpanded version offers advantages of better control of the final particle size as well as increased ease of use. The weight percent of the microspheres in the composition depends on the final relief desired and typically ranges from about 1% to about 15% by weight of the photopolymer formulation.

Regardless of whether the microspheres are expanded or unexpanded, the microspheres generally consist of a thermoplastic shell encapsulating a hydrocarbon. The shell of the microsphere is typically a copolymer of acrylonitrile and vinylidene chloride or methacrylonitrile, and the hydrocarbon inside the shell is typically isobutane or isopentane. There are a number of commercial sources for thermoplastic microspheres. EXPANCEL® is a trade name for microspheres available from Noble Industries. Dualite and Micropearl polymeric microspheres are available from Pierce & Stevens Corporation.

The function of the microspheres in the curable elastomer composition of the invention is to decrease the final density of the plate formulation. Both expanded and unexpanded microspheres are usable in the collapsible curable layer(s) of the invention. The microspheres allow for printing element manufacturing under extruder conditions, while at the same time allowing the curable elastomer composition to collapse and melt when heated to laser imaging temperatures. During the collapsing step, hydrocarbon gas trapped in the shell of the microspheres is released.

The choice of the microspheres governs the manufacturing method. The collapsible, but "expanded" formulations of the invention are mixed in a sigma mixer and extruded on a single screw extruder. The collapsible, and "unexpanded" formulations may be extruded in a twin-screw extruder.

If unexpanded microspheres are used in the collapsible curable layer(s) of the invention, the printing element is baked to create expansion of the curable layer(s) prior to using a laser to collapse and melt portions of the collapsible curable elastomer layer(s). Baking is accomplished in an oven at a temperature which is chosen to be above the $T_{max}$ of the microspheres, which depending on the manufacturer, may range from about 100° C. to about 200° C., for a very short period of time, usually 5–10 minutes, until complete expansion has taken place.

When the thermoplastic shell is heated, it softens and at the same time the pressure of the hydrocarbon increases, causing the shell to stretch and expand. When the heat is removed, the shell stiffens and the microspheres remain in their new expanded form. The temperature reached during the extrusion step governs the size of the microspheres. Care is taken to avoid temperatures above the maximum temperature of expansion of the microspheres ($T_{max}$), above which the microspheres start to contract. Microspheres are thus chosen having a $T_{max}$ that is much higher than the manufacturing temperature of the elastomeric composition. Unexpanded microspheres typically show particle size increase from about 6–16 μm to about 20–40 μm, with a corresponding density change from 1.1 g/cm³ to 0.04–0.06 g/cm³.

Table 1 summarizes typical properties of various unexpanded microspheres available from Noble Industries. In the microsphere formulations shown, the density changes from 0.8–1.0 g/cm³ in the unexpanded form to approximately 0.13–0.065 g/cm³ in the expanded form, depending on the final particle size achieved.

TABLE 1

Typical Properties of Commercially Available Unexpanded Microspheres from Noble Industries

| Expancel DU | Particle size | T-start, °F. | T-max, °F. | Density (g/cm³) |
|---|---|---|---|---|
| 551 DU 20 | 6–9 μm | 199–208 | 264–279 | 0.06 |
| 551 DU 40 | 10–16 μm | 199–208 | 264–279 | 0.04 |
| 051 DU 40 | 9–15 μm | 223–232 | 280–297 | 0.06 |
| 009 DU 80 | 18–24 μm | 237–255 | 329–356 | 0.06 |
| 091 DU 40 | 10–16 μm | 234–252 | 361–379 | 0.04 |

Table 2 summarizes typical properties of various unexpanded microspheres available from Pierce & Stevens Corporation. In the microsphere formulations shown, the density changes from 0.8–1.0 g/cm³ in the unexpanded form to approximately 0.02–0.03 g/cm³ in the expanded form, depending on the final particle size achieved.

TABLE 2

Typical Properties of Commercially Available Unexpanded Microspheres from Pierce and Stevens

| Micropearl | Density(g/cm³) (Before Expansion) | T-start, °F. | T-max, °F. | Density (g/cm³) (After Expansion) |
|---|---|---|---|---|
| F50D | 0.8–1.0 | 212 | 284 | 0.03 |
| F46D1 | 0.8–1.0 | 212 | 284 | 0.02 |
| F80D1 | 0.8–1.0 | 284 | 320–338 | 0.02 |

Expanded microspheres may also be usable in the method of the present invention. In this instance, a Sigma-mixing step followed by single screw extrusion is employed.

Table 3 summarizes typical properties of various expanded microspheres available from Noble Industries.

TABLE 3

Typical Properties of Commercially Available Expanded Microspheres from Noble Industries

| Expancel DE | Particle size | T-max, °F. | Density (g/cm³) |
|---|---|---|---|
| 551 DE 20 d60 | 15–25 μm | 264–279 | 0.06 |
| 551 DE 40 d42 | ~40 μm | 264–279 | 0.04 |
| 051 DE 40 d60 | 20–40 μm | 280–297 | 0.06 |
| 009 DE 80 | ~80 μm | 329–356 | 0.06 |
| 091 DE 40 d30 | ~40 μm | 361–379 | 0.03 |

Laser Light Absorbing Material

The curable elastomers as well as the microspheres of the invention are typically not very sensitive to IR radiation. To increase the sensitivity of the photopolymer elastomer composition to the IR radiation of the lasers in the plate-setters, a material that absorbs laser light at a selected wavelength, such as an IR dye or pigment, is required. Thus, the main function of the material that absorbs laser light at a selected wavelength, i.e., IR dye or pigment, is to make a normally IR transmissive compound IR absorbing. As the IR laser strikes the dye, it transfers the energy from IR-photons into heat, causing "laser-collapse" of the micro-bubbles or microspheres. During the laser-collapsing process step, very little, if any of the elastomer mass is removed. Upon collapsing, the microspheres release the trapped hydrocarbon gases, which are vented out. As the material consists of foam cells which are microns in size, the ablation-to-depth process can occur much more quickly, using much lower energy, than is required in true mass transfer systems such as mask ablation or polymer engraving.

When EB is used for curing the photocurable composition, it is not required that the IR dye/pigment be UV transmissive, although it is preferred. However, when UV curing is used, it is essential that the IR dye/pigment be UV transmissive. In this instance, if the IR dye/pigment was also UV absorbing, it would not be possible to through-cure the plate, and the plate would be rendered unusable. Therefore, when UV curing is utilized, one of the key requirements of the laser dye or pigment is that it is essentially transmissive in the UV regime between 350–400 nm, so that it will not interfere during the subsequent UV-curing step.

Typically, the laser dyes are essentially monochromatic, and the choice of the plate-setter laser wavelength, either 830 nm or 1064 nm, governs the choice of the dye. The level of dye loading depends on the extinction coefficient of the dye at the operating wavelength, but generally ranges from about 0.01% to about 5% by weight of the photopolymer formulation.

Several IR-absorbing/UV-transmissive dyes are commercially available. ADS830A and ADS1060A (available from American Dye Source, Inc.) are examples of dyes usable in the present invention. Other dyes and pigments are available from Lambda Physik, Exciton, Inc., Acros Organics USA, Clarion Corp., and Zeneca, Inc.

Laser Imaging

One of the major advantages of the concept of the present invention is that most customers of traditional digital flexography can practice the invention with only a change in software. Unlike other processless printing elements of the prior art, no major investments in hardware are needed to practice the present invention.

There are 2 types of plate setters that are generally in use, which operate at either 830 nm or 1064 nm. Because of the monochromatic nature of the IR dye, each of the different plate setters needs a different dye, and hence plates with different formulations.

The laser is employed to precisely collapse the radiation-curable elastomer at specific points, thus creating an image by virtue of laser collapsed and uncollapsed areas on the printing sleeve. The laser collapse approach has entirely different, and lower power density needs, than are currently employed in laser ablation or laser engraving. In fact, above a certain power density the material will tend to ablate or degrade and care will need to be taken to stay below this threshold power density.

A combination of laser power, laser spot size, and dwell time are optimized to produce the preferred range of energy and power density. Changes in the commercial plate-setter software may be necessary for this application.

This invention is further described by the following examples, which should be taken as illustrative only and not limiting in any regard.

EXAMPLE 1

Preparation of a Processless Flexographic Plate Using Unexpanded Microspheres Sensitive to 830 nm Lasers A printing plate is manufactured according to the composition listed in Table 4, using unexpanded microspheres (Expancel DU microspheres). The ingredients are mixed in a Sigma mixer, and the temperature of the mixer is slowly and gradually increased, until it reaches the "optimum" expansion temperature for the unexpanded microspheres to increase their volume. The optimum expansion temperature is determined through routine experimentation, and depends on the particular type and size of unexpanded microspheres that are used. Care is taken not to exceed the "maximum" expansion temperature so as to avoid microsphere collapse. The composition is hot-pressed between 2 clear polyethylene terephthalate sheets (PETs) at a temperature that is below the maximum expansion temperature of the microspheres. One of the two PETs has a slip film or release coating to facilitate easy removal.

Alternately and preferably, the plate is manufactured in a twin-screw extruder. In the twin-screw extruder, the ingredients listed in Table 4 are partitioned into solids and pre-mixes. The solid and liquid streams are mixed initially at a temperature below the expansion temperature of the microspheres for complete mixing. The temperature of the barrel zones is gradually increased to create in situ expansion. The compound is then extruded and calendared to gage between two PETs, one of which has a slip film or release coating to facilitate easy removal.

The plate is back-exposed through the backing, the coversheet is removed and discarded and the plate is then mounted on a commercially available 830 nm flexographic plate-setter such as Creo's ThermoFlex® 5280. The digital file from the computer is transferred onto the plate. In the areas where the laser interacts with the photopolymer, the microspheres collapse, creating a relief. Different energy densities are employed to create areas of deep and shallow relief.

During the main laser collapse process, a "flash" or "bump" exposure is utilized throughout the plate to collapse a monolayer on the surface to form a denser layer and create the ultimate printing surface. The plate is then cured by a conventional face exposure and post-cured to hold 1% dots at 133 lines per inch (LPI).

TABLE 4

Formulation Scheme for Unexpanded or Expanded Microspheres Sensitive to 830 nm Lasers (Collapsible Layer)

| Ingredient | Weight % |
|---|---|
| Kraton ® D1102 | 57.37 |
| Shellflex ® 6371 | 21.19 |
| HDDA | 5.30 |
| TMPTMA | 5.30 |
| Irgacure ® 651 | 3.30 |
| BHT | 2.27 |
| Irganox ® 1010 | 0.03 |
| Calcium Stearate | 0.13 |
| Tinuvin ® 1130 | 0.01 |
| ADS830A dye | 0.10 |
| Expancel DU or DE Microspheres | 5.00 |
| | 100.0 |

EXAMPLE 2

Preparation of a Processless Flexographic Plate Using Unexpanded Microspheres Sensitive to 1064 nm Lasers A similar procedure to Example 1 is followed, using the composition listed in Table 5, where the microspheres are unexpanded microspheres (Expancel DU microspheres). The subsequent plate development and manufacture is the same as in Example 1, except that a commercially available 1064 nm plate-setter such as Barco's CDI™ is used instead. The digital file from the computer is transferred onto the plate. In the areas where the laser interacts with the photopolymer, the microspheres collapse, creating a relief. Different energy densities are employed to create areas of deep and shallow relief.

During the main laser collapse step, a "flash" or "bump" exposure is used throughout to collapse a monolayer on the surface to form a denser layer and create the ultimate printing surface. The plate is cured by a conventional face exposure and post-cured to hold 1% dots at 133 lines per inch (LPI).

TABLE 5

Formulation Scheme for Unexpanded or Expanded Microspheres Sensitive to 1064 nm Lasers (Collapsible Layer)

| Ingredient | Weight % |
|---|---|
| Kraton ® D1102 | 57.37 |
| Shellflex ® 6371 | 21.19 |
| HDDA | 5.30 |
| TMPTMA | 5.30 |
| Irgacure ® 651 | 3.30 |
| BHT | 2.27 |
| Irganox ® 1010 | 0.03 |
| Calcium Stearate | 0.13 |
| Tinuvin ® 1130 | 0.01 |
| ADS1060A dye | 0.10 |
| Expancel DU or DE Microspheres | 5.00 |
| | 100.0 |

EXAMPLE 3

Preparation of a Processless Flexographic Plate Using Expanded Microspheres Sensitive to 830 nm Lasers A printing plate is manufactured according to the composition listed in Table 4, using expanded microspheres (Expancel DE microspheres). The ingredients are mixed in a Sigma mixer, and the compound is hot-pressed between 2 clear PETs, one of which has a slip film or release coating. Alternately, the plate is manufactured in a twin-screw extruder.

After lamination, the coversheet is removed and discarded. The plate is back-exposed through the backing, and mounted on a commercially available 830 nm flexographic plate-setter such as Creo's ThermoFlex® 5280. The digital file from the computer is transferred onto the plate. In the areas where the laser interacts with the photopolymer, the microspheres will collapse, creating a relief. Different energy densities are employed to create areas of deep and shallow relief.

During the main laser collapse step, a "flash" or "bump" exposure is used throughout the plate to collapse a monolayer on the surface to form a denser layer and create the ultimate printing surface. The plate is then cured by a conventional face exposure and post-cured to hold 1% dots at 133 lines per inch (LPI).

EXAMPLE 4

Preparation of a Processless Flexographic Plate Using Expanded Microspheres Sensitive to 1064 nm Lasers A similar procedure to Example 3 is used, except that the composition of Table 5 is used instead of the composition of Table 4, with expanded microspheres (Expancel DE microspheres). The subsequent plate development and manufacture are the same as before, except that a commercially available 1064 nm plate-setter such as Barco's CDI™ is used. The digital file from the computer is transferred onto the plate. In the areas where the laser interacts with the photopolymer, the microspheres will collapse, creating a relief. Different energy densities are employed to create areas of deep and shallow relief.

During the main laser collapse process, a "flash" or "bump" exposure is used throughout to collapse a monolayer on the surface to form a denser layer and create the ultimate printing surface. The plate is then cured by a conventional face exposure and post-cured to hold 1% dots at 133 lines per inch (LPI).

EXAMPLE 5

Preparation of a Processless Flexographic Plate Using Unexpanded Microspheres Sensitive to 830 mn Lasers and Having a Non-Collapsible Layer A printing plate having a collapsible bulk layer and a thin collapsible print layer is manufactured as follows.

The collapsible composition listed in Table 4 is used with unexpanded microspheres (Expancel DU microspheres). The ingredients are mixed in a Sigma mixer, and the temperature of the mixer is slowly and gradually increased, until it reaches the "optimum" expansion temperature for the unexpanded microspheres to increase their volume. The optimum expansion temperature is determined through routine experimentation, and depends on the particular type and size of unexpanded microspheres that are used. Care is taken not to exceed the "maximum" expansion temperature so as to avoid microsphere collapse.

Alternately and preferably, the plate is manufactured in a twin-screw extruder. In the twin-screw extruder, the ingredients listed in Table 4 are partitioned into solids and pre-mixes. The solid and liquid streams are mixed initially at a temperature below the expansion temperature of the microspheres for complete mixing. The temperature of the barrel zones is gradually increased to create in situ expansion. The compound is extruded and calendared to gage with the "non-collapsible" construction, as described below.

The "non-collapsible" print layer composition is listed in Table 6. The compound is mixed in a sigma mixer. Alternately, and preferably a twin-screw extruder can be employed to produce the final compound. The compound is either hot pressed onto the PET having a thin slip coating (thickness~0.2 mils), or may be extruded directly onto the PET having the above slip coating to get the "non-collapsible" construction. The thickness of the non-collapsible layer is kept to about 2 mils.

Another way to obtain the "non-collapsible" construction is to use the traditional cap layer described in the literature and as used in MacDermid's Flexlight® EPIC plate. In this instance, the cap layer with the slip coating is toll manufactured and used just before the final plate manufacture as delineated below.

The final plate construction is arrived at by one of two methods. The collapsible compound from above is hot-pressed onto a backing PET and laminated to the above "non-collapsible" construction to get the final printing plate. Alternately, and preferably the collapsible layer could be extruded directly onto the backing PET and calendared to gage with the above "non-collapsible" construction.

The plate is back-exposed through the backing, the coversheet is removed and discarded, and the plate is then mounted on a commercially available 830 nm flexographic plate-setter such as Creo's ThermoFlex® 5280. The digital file from the computer is transferred onto the plate. In the areas where the laser interacts with the bulk photopolymer, the microspheres will collapse, creating a relief. The thin, "non-collapsible" layer is insensitive to the laser and will simply collapse with the underlying collapsible layer. Different energy densities are employed to create either deep or shallow relief. The plate is then cured by a conventional face exposure and post-cured to hold 1% dots at 133 lines per inch (LPI).

TABLE 6

Formulation Scheme for the Non-collapsible Layer

| Ingredient | Weight % |
|---|---|
| Kraton ® D1102 | 60.46 |
| Shellflex ® 6371 | 22.33 |
| HDDA | 5.58 |
| TMPTMA | 5.58 |
| Irgacure ® 651 | 3.48 |
| BHT | 2.39 |
| Irganox ® 1010 | 0.03 |
| Calcium Stearate | 0.14 |
| Tinuvin ® 1130 | 0.01 |
| | 100.0 |

EXAMPLE 6

Preparation of a Processless Flexographic Plate Using Unexpanded Microspheres Sensitive to 1064 nm Lasers and Having a Non-Collapsible Layer A procedure similar to Example 5 is followed, using the collapsible composition listed in Table 5, and unexpanded microspheres (Expancel DU microspheres). The "non-collapsible" composition is identical to Example 5 and as listed in Table 6.

The subsequent plate development and manufacture is the same as in Example 5, except for the plate-setter. A commercially available 1064 nm plate-setter such as Barco's CDI™ is used instead. The digital file from the computer is transferred onto the plate. In the areas where the laser interacts with the photopolymer, the microspheres will collapse, creating a relief. The "non-collapsible" layer is insensitive to the laser and will simply collapse with the underlying collapsible layer. Different energy densities are employed to create either deep or shallow relief. The plate is then cured by a conventional face exposure and post-cured to hold 1% dots at 133 lines per inch (LPI).

COMPARATIVE EXAMPLE 7

Preparation of a Processless Flexographic Plate Using Laser Engraving with 830 nm Lasers A printing plate is manufactured using the composition listed in Table 7, which formula does not contain microspheres. The listed ingredients are mixed together in a Sigma mixer. The composition is then hot-pressed between 2 clear PETs, one of which has a slip film or release coating.

After lamination, the coversheet is removed and discarded. The plate is completely cured through using long UV face-exposure (FEX) times. The cured plate is mounted on a commercially available 830 nm flexographic plate-setter such as Creo's ThermoFlex® 5280. The digital file from the computer is transferred onto the plate. In the areas where the laser interacts with the photopolymer, the polymer will engrave, creating a relief. Much larger energy densities are needed to create deep relief. In order to achieve such high energy densities, the plate-setter needs to be run at extremely slow speeds. In addition, due to the heat generated, it is not possible to hold finer details.

TABLE 7

Formulation Scheme for a Processless Flexographic Plate Using Laser Engraving with 830 NM Lasers

| Ingredient | Weight % |
| --- | --- |
| Kraton ® D1102 | 60.39 |
| Shellflex ® 6371 | 22.31 |
| HDDA | 5.58 |
| TMPTMA | 5.58 |
| Irgacure ® 651 | 3.47 |
| BHT | 2.39 |
| Irganox ® 1010 | 0.03 |
| Calcium Stearate | 0.14 |
| Tinuvin ® 1130 | 0.01 |
| ADS830A dye | 0.10 |
| | 100.0 |

COMPARATIVE EXAMPLE 8

Preparation of a Processless Flexographic Plate Using Laser Engraving with 1064 nm Lasers A printing plate is manufactured with the composition listed in Table 8, which formula does not contain microspheres. The listed ingredients are mixed together in a Sigma mixer. The composition is then hot-pressed between 2 clear PETs, one of which has a slip film or release coating.

After lamination, the coversheet is removed and discarded. The plate is completely cured through using long UV face exposure (FEX) times. The cured plate is mounted on a commercially available 1064 NM plate-setter such as Barco's CDI™. The digital file from the computer is transferred onto the plate. In the areas where the laser interacts with the photopolymer, the polymer will engrave, creating a relief. Much larger energy densities are needed to create deep relief. In order to achieve such high energy densities, the plate-setter needs to run at extremely slow speeds. Also, due to the heat generated, it is not possible to hold finer details.

TABLE 8

Formulation Scheme for a Processless Flexographic Plate Using Laser Engraving with 1064 nm Lasers

| Ingredient | Weight % |
| --- | --- |
| Kraton D1102 | 60.39 |
| Shellflex 6371 | 22.31 |
| HDDA | 5.58 |
| TMPTMA | 5.58 |
| Irgacure 651 | 3.47 |
| BHT | 2.39 |
| Irganox 1010 | 0.03 |
| Calcium Stearate | 0.14 |
| Tinuvin 1130 | 0.01 |
| ADS1060A | 0.10 |
| | 100.0 |

EXAMPLE 9

Preparation of the "Thin" and "Thick" Hollow Cylindrical Sleeve

A mandrel is first inspected for imperfections or defects and thoroughly cleaned. A mold release agent is then applied to the mandrel and the mandrel is pre-heated to about 100° to 120° F. An epoxy resin and hardener (Ratio approximately 3.3:1) are mixed by hand for 1–2 minutes until the mixture thickens, and the resin-hardener mixture is then applied to the mandrel. Type 106-glass fabric pre-cut into 4-inch widths is wrapped around mandrel to be sure that the fabric is totally wetted out. The polymer-glass composite is then allowed to crosslink or gel by applying heat for about 30 minutes. The sleeve is removed from the mandrel while the sleeve and mandrel are still hot by introducing compressed air between the sleeve and mandrel to assist with the removal, and is then baked for 4 hours at 120° F. After the baking step the sleeve is further machined or ground to the specified gage (approximately 16 mil±½ mil wall thickness).

A "thick" Versaflex Hollow Cylindrical Base can be manufactured in a similar way. The resin-hardener mixture is saturated onto Kevlar® cloth on the mandrel. Type 106-glass fabric pre-cut into 4-inch width is wrapped around mandrel on top of the Kevlar® along with the resin-hardener mixture to be sure that the fabric is totally wetted out. This is repeated until the desired thickness is achieved (usually about 50–90 mils). The Kevlar®-polymer-glass composite is then allowed to crosslink or gel by applying heat for about 30 minutes. The thick sleeve is removed from the mandrel while the sleeve and mandrel are still hot by introducing compressed air between the sleeve and mandrel to assist with the removal. The sleeve is then baked for 4 hours at 120° F. After the baking step, the sleeve is further machined or ground to the specified gage (approximately 40–80 mil wall thickness).

EXAMPLE 10

Preparation of a Processless Flexographic Sleeve Sensitive to 830 nm or 1064 nm Lasers A printing sleeve is manufactured according to the composition listed in Table 4 or 5, using either unexpanded microspheres (Expancel DU) or expanded microspheres (Expancel DE). The ingredients are either mixed in a Sigma mixer (expanded microspheres) followed by single-screw extrusion, or mixed and expanded in a twin-screw extruder (unexpanded microspheres). Either way, the composition is further extruded onto the thin or thick sleeve described in Example 9.

Expansion of the unexpanded microspheres in the composition takes place during the extrusion step in the twin-screw extruder. This layer is then completely cured from the top using either UV or EB curing, and the resulting floor layer is ground to gage. A second collapsible imaging layer having the composition described in Table 4 or 5 is then extruded on top followed by a cap layer having the composition described in Table 6. Alternately, the last 2 layers may be co-extruded. The cap layer is further ground to gage and made seamless. This cap layer then becomes the printing surface.

The sleeve is mounted on a commercially available 830 nm flexographic plate-setter such as Creo's ThermoFlex® 5280 (using the collapsible layer composition of Table 4) or a commercially available 1064 nm plate-setter such as Barco's CDI™ (using the collapsible layer composition of Table 5) having sleeve mounting capabilities. The digital file from the computer is transferred onto the sleeve. In the areas where the laser interacts with the photopolymer underneath the cap layer, the microspheres collapse, creating a relief. Different energy densities are employed to create either deep or shallow relief.

The printing sleeve is then cured by a conventional face exposure and post-cured to hold 1% dots at 133 lines per inch (LPI). Alternately, face exposure can be accomplished by EB curing.

EXAMPLE 11

Preparation of a Processless Flexographic Sleeve Sensitive to 830 nm or 1064 nm Lasers Using a UV Transmissive Carrier for Back Exposure A printing sleeve is manufactured according to the composition listed in Table 4 or 5, using either unexpanded microspheres (Expancel DU) or expanded microspheres (Expancel DE). The ingredients are mixed in a Sigma mixer (expanded microspheres) followed by single-screw extrusion, or mixed and expanded in a twin-screw extruder (unexpanded microspheres). Once mixed, the composition is extruded onto a thin UV transmissive PET sleeve.

In the case of unexpanded microspheres, expansion takes place during the extrusion step in the twin-screw extruder, and this layer is then ground to gage. A second non-collapsible cap layer is then extruded on top having the composition described in Table 6. The cap layer is then ground to form a seamless print surface. Alternately, the above 2 layers can be co-extruded and made seamless, without the intermediate grinding step of the collapsible layer. A back exposing step through the PET carrier then establishes a floor layer.

The sleeve is mounted on a commercially available 830 nm flexographic plate-setter such as Creo's ThermoFlex® 5280 (using the collapsible layer composition of Table 4) or a commercially available 1064 nm plate-setter such as Barco's CDI™ (using the collapsible layer composition of Table 5) having sleeve mounting capabilities. The digital file from the computer is transferred onto the sleeve. In the areas where the laser interacts with the photopolymer underneath the cap layer, the microspheres will collapse, creating a relief. Different energy densities are employed to create either deep or shallow relief.

The printing sleeve is then cured by a conventional face exposure and post-cured to hold 1% dots at 133 lines per inch (LPI). Alternately, face exposure can be accomplished by EB curing.

EXAMPLE 12

Preparation of a Processless Flexographic Sleeve Sensitive to 830 nm or 1064 nm Lasers Using Unexpanded Microspheres and Causing Expansion After Extrusion A printing sleeve is manufactured according to the composition listed in Table 7 or 8, using unexpanded microspheres (Expancel DU microspheres). The ingredients are mixed in a Sigma mixer and the composition is further extruded onto the thin or thick sleeve described in Example 9 using a single-screw extruder. Care was taken to stay below the temperature of expansion as much as possible. This layer was then completely cured from the top using either UV or EB curing. The floor layer was then ground to gage. A second collapsible but unexpanded imaging layer having the composition shown in Table 7 or 8 is further extruded on top followed by extruding a cap layer having the composition of Table 6. Alternately, the last 2 layers can be co-extruded. The cap layer is further ground to gage and made seamless. The whole assembly was inserted in an oven at a temperature above the $T_{max}$ of the microsphere for 5–10 minutes until complete expansion of the microspheres has taken place.

Alternately, if a PET sleeve carrier is employed, the curing/grinding step is circumvented and the floor is created by back exposure (BEX) through the sleeve carrier.

After expansion, the sleeve is mounted on a commercially available 830 nm flexographic plate-setter such as Creo's ThermoFlex® 5280 (using the collapsible layer composition of Table 7) or a commercially available 1064 nm plate-setter such as Barco's CDI™ (using the collapsible layer composition of Table 8) having sleeve mounting capabilities. The digital file from the computer is transferred onto the sleeve. In the areas where the laser interacts with the photopolymer underneath the cap, the microspheres will collapse, creating a relief. Different energy densities are employed to create areas of deep and shallow relief.

The printing sleeve is then cured by a conventional face exposure and post-cured to hold 1% dots at 133 lines per inch (LPI). Alternately, face exposure can be accomplished by EB curing.

What is claimed is:

1. A method of making a digitally imaged relief-printing plate comprising the steps of:
   a) providing a collapsible curable layer comprising (i) a curable elastomer, (ii) a material that absorbs laser light at a selected wavelength, and (iii) microspheres, between a cover sheet and a backing sheet to form a printing plate;
   b) exposing the collapsible curable layer through the backing sheet to establish a floor layer;
   e) removing the cover sheet from the printing plate;
   d) using a laser to collapse and melt portions of the collapsible curable layer to form a relief image on the printing plate; and
   e) curing said curable layer by face exposure to crosslink and cure said formed relief image.

2. A method according to claim 1, wherein said printing plate further comprises a thin layer of non-collapsible curable elastomer between the collapsible curable layer and the cover sheet of the plate.

3. A method according to claim 1, wherein said curable layer is cured by exposure to UV radiation.

4. A method according to claim 1, wherein as the relief image is formed on the printing plate, the printing plate is simultaneously bump-exposed, to collapse at least a portion of said collapsible curable layer to create a final printing surface on said printing plate.

5. A method according to claim 1, further comprising a step of laser collapsing at least a portion of said formed image to form a denser printing surface.

6. A method according to claim 1, wherein the backing sheet comprises polyethylene terephthalate.

7. A method according to claim 1, wherein the cover sheet further comprises a slip film or a release layer.

8. A method according to claim 1, wherein the curable elastomer of the collapsible curable layer comprises a binder, a plasticizer, one or mare curable monomers, and a photoinitiator.

9. A method according to claim 8, wherein said one or more curable monomers are curable by UV-light.

10. A method according to claim 1, wherein the microspheres are selected from the group consisting of expanded microspheres and unexpanded microspheres.

11. A method according to claim 10, wherein said unexpanded microspheres have an initial particle size of 6–16 $\mu$m and a particle size upon expansion of 20–40 $\mu$m, with a corresponding change in density from about 0.8 to 1.1 g/cm$^3$ to between about 0.02 and about 0.06 g/cm$^3$.

12. A method according to claim 1, wherein the collapsible curable elastomer composition comprises about 1% to about 15%, by weight, of the microspheres.

13. A method according to claim 10, wherein said microspheres are unexpanded microspheres and the collapsible curable elastomer composition is first mixed at a temperature below the expansion temperature of said unexpanded microspheres and the temperature is then gradually increased to facilitate expansion of the microspheres.

14. A method according to claim 1, wherein the collapsible curable elastomer layer comprises about 0.01 to about 5 percent, by weight, of the material that absorbs laser light at the selected wavelength.

15. A method according to claim 1, wherein said laser is a plate setter infrared laser operating at a wavelength of 830 nanometers or 1064 nanometers.

16. A method according to claim 15, wherein said material that absorbs laser light at the selected wavelength is selected based on the operating wavelength of the plate-setter laser.

17. A method according to claim 16, wherein the material that absorbs laser light at the selected wavelength is an infrared dye or pigment.

18. A method according to claim 17, wherein the infrared dye or pigment is UV-transmissive at wavelengths between 350 and 400 nanometers.

19. A method according to claim 1, wherein the laser is an IR-laser that uses different energy densities to create areas of different depths on the relief image.

20. A method according to claim 1, further comprising a step of post curing and detacking said printing plate.

21. A digitally imaged relief-printing plate comprising:
   a collapsible curable layer comprising: (i) a curable elastomer, (ii) a material that absorbs laser light at the selected wavelength, and (iii) microspheres;
   wherein the printing plate comprises a relief image formed from selectively collapsed and melted portions of the collapsible curable layer; and
   wherein the printing plate is cured to cross link and cure said relief image.

22. A printing plate according to claim 21, wherein said printing plate further comprises a thin layer of non-collapsible curable elastomer.

23. A printing plate according to claim 21, wherein said curable layer is cured by exposure to UV radiation.

24. A printing plate according to claim 21, further comprising a collapsed top layer of the collapsible curable layer that creates a denser printing surface.

25. A printing plate according to claim 21, wherein an IR-laser is used to produce said selected collapsed and melted portions of the collapsible curable layer.

26. A printing plate according to claim 21, further comprising a polyethylene terephthalate backing sheet.

27. A printing plate according to claim 21, further comprising a coversheet having a slip film or a release layer.

28. A printing plate according to claim 21, wherein the curable elastomer of the collapsible curable layer comprises a binder, a plasticizer, one or more curable monomers, and a photoinitiator.

29. A printing plate according to claim 28, wherein said one or more curable monomers are curable by UV-light.

30. A printing plate according to claim 21, wherein the microspheres are selected from the group consisting of expanded microspheres and unexpanded microspheres.

31. A printing plate according to claim 21, wherein the collapsible curable elastomer layer comprises about 5% to about 15%, by weight, of the microspheres.

32. A printing plate according to claim 30, wherein said microspheres are unexpanded microspheres and the collapsible curable layer is first mixed at a temperature below the expansion temperature of said unexpanded microspheres and the temperature is then gradually increased to facilitate expansion of the microspheres.

33. A printing plate according to claim 21, wherein the collapsible curable layer comprises about 0.01 to about 5 percent by weight, of the material that absorbs laser light at the selected wavelength.

34. A printing plate according to claim 25, wherein said material that absorbs laser light at the selected wavelength is an infrared dye or pigment that is selected based on the operating wavelength of the IR-laser.

35. A printing plate according to claim 34, wherein the infrared dye or pigment is UV-transmissive at wavelengths between 350 and 400 nanometers.

36. A printing plate according to claim 25, wherein the IR-laser uses different energy densities to create areas of different depths on the relief image.

37. A printing plate according to claim 24, wherein said printing plate is further post cured and detacked.

38. A method of making a laser imageable printing sleeve comprising the steps of:
  a) providing at least one collapsible curable layer on a sleeve carrier;
  b) providing a cap layer of a non-collapsible curable elastomer on the at least one collapsible curable layer;
  c) using a laser to collapse and melt portions of the at least one collapsible curable layer to forming a relief image on the printing sleeve with the cap layer acting as the printing surface; and
  d) curing the printing sleeve by face exposure to crosslink the formed relief image.

39. The method according to claim 38, wherein said sleeve carrier is selected from the group consisting of metals, polymeric films, and polymer/fiber composites.

40. The method according to claim 38, wherein said at least one collapsible curable layer comprises (i) one or more tumble elastomers; (ii) a material that absorbs laser light at a selected wavelength; and (iii) microspheres.

41. The method according to claim 40, wherein the microspheres are selected from the group consisting of expanded microspheres and unexpanded microspheres.

42. The method according to claim 41, wherein said microspheres are unexpanded microspheres and after step b) but before step c), the printing sleeve is baked to create expansion of the at least one collapsible radiation-curable layer.

43. The method according to claim 38, wherein after step b) and prior to step c), the cap layer is ground to gage and to form a seamless structure having a smooth print surface.

44. The method according to claim 40, wherein said at least one collapsible curable layer comprises about 1% to about 15%, by weight, of the microspheres.

45. The method according to claim 40, wherein the at least one collapsible curable layer comprises about 0.01 to about 5 percent, by weight, of the material that absorbs laser light at the selected wavelength.

46. The method according to claim 38, wherein said laser is an infrared laser.

47. The method according to claim 40, wherein said material that absorbs laser light at the selected wavelength is an infrared dye or pigment that is selected based on the operating wavelength of the laser.

48. The method according to claim 47, wherein the operating wavelength of the laser is 830 nanometers or 1064 nanometers.

49. The method according to claim 48, wherein the infrared dye or pigment is UV-transmissive at wavelengths between 350 and 400 nanometers.

50. The method according to claim 46, wherein the laser uses different energy densities to create areas of different depths on the relief image.

51. The method according to claim 38, further comprising a step of post curing and detacking said printing sleeve.

52. A method of making a laser imageable printing sleeve comprising the steps of:
  a) providing a first collapsible curable layer on a sleeve carrier;
  b) curing said first collapsible curable layer to establish a floor layer;
  c) providing a second collapsible curable layer on top of said cured floor layer;
  d) providing a cap layer comprising a non-collapsible curable elastomer layer on top of said second collapsible curable layer;
  e) using a laser to collapse and melt portions of the underlying second collapsible curable layer to form a relief image on the printing sleeve; and
  f) curing the printing sleeve by face exposure to crosslink and cure said formed relief image.

53. The method according to claim 52, wherein said second collapsible curable layer and said cap layer are co-extruded.

54. The method according to claim 52, wherein said sleeve carrier is selected from the group consisting of metals, polymeric films, and polymer/fiber composites.

55. The method according to claim 52, wherein said first and second collapsible curable layers comprise (i) a curable elastomer; (ii) a material that absorbs laser light at a selected wavelength; and (iii) microspheres.

56. The method according to claim 55, wherein the microspheres are selected from the group consisting of expanded microspheres and unexpanded microspheres.

57. The method according to claim 56, wherein said microspheres are unexpanded microspheres and after step d) but before step e), the printing sleeve is baked to create expansion of the second collapsible curable layer.

58. The method according to claim 55, wherein the collapsible curable elastomer composition comprises about 1% to about 15%, by weight of the microspheres.

59. The method according to claim 55, wherein the collapsible radiation-curable elastomer composition comprises about 0.01 to about 5 percent, by weight, of the material that absorbs laser light at the selected wavelength.

60. The method according to claim 52, wherein said laser is an infrared laser.

61. The method according to claim 55, wherein said material that absorbs laser light at the selected wavelength is an infrared dye or pigment and is selected based on the operating wavelength of the laser.

62. The method according to claim 61, wherein the operating wavelength of the laser is 830 nanometers or 1064 nanometers.

63. The method according to claim 61, wherein the infrared dye or pigment is UV-transmissive at wavelengths between 350 and 400 nanometers.

64. The method according to claim 60, wherein the laser uses different energy densities to create areas of different depths on the relief image.

65. The method according to claim 52, further comprising a step of post curing and detacking said printing sleeve.

66. A method of making a laser imageable printing sleeve comprising the steps of:
  a) providing a collapsible curable layer comprising (i) a curable elastomer, (ii) a material that absorbs laser light at a selected wavelength, and (iii) microspheres, on a transparent sleeve carrier;
  b) providing a cap layer comprising a non-collapsible curable elastomer layer on top of said collapsible curable layer;
  c) exposing said collapsible curable layer through the transparent sleeve carrier to establish a floor layer;
  d) using a laser to collapse and melt portions of the collapsible curable layer to form a relief image on the printing sleeve; and e) curing the printing sleeve by face exposure to crosslink and cure said formed relief image.

67. The method according to claim 66, wherein said collapsible curable layer and said cap layer are co-extruded.

68. The method according to claim 66, wherein said transparent sleeve carrier comprises polyethylene terephthalate.

69. The method according to claim 66, wherein the microspheres are selected from the group consisting of expanded microspheres and unexpanded microspheres.

70. The method according to claim 69, wherein said microspheres are unexpanded microspheres and after stop c) but before step d), the printing sleeve is baked to create expansion of the collapsible curable layer.

71. The method according to claim 66, wherein after step c) and before step d), the cap layer is ground to gage and to form a seamless structure having a smooth print surface.

72. The method according to claim 66, wherein the collapsible curable layer comprises about 1% to about 15%, by weight, of the microspheres.

73. The method according to claim 66, wherein the collapsible curable layer comprises about 0.01 to about 5 percent, by weight, of the material that absorbs laser light at the selected wavelength.

74. The method according to claim 66, wherein said laser is an infrared laser operating at a wavelength of 830 nanometers or 1064 nanometers.

75. The method according to claim 73, wherein said material that absorbs laser light at the selected wavelength is an infrared dye or pigment and is selected based on the operating wavelength of the laser.

76. The method according to claim 75, wherein the infrared dye or pigment is UV-transmissive at wavelengths between 350 and 400 nanometers.

77. The method according to claim 75, wherein the laser uses different energy densities to create areas of different depths on the relief image.

78. The method according to claim 66, further comprising a step of post curing and detacking said printing sleeve.

79. A digitally imageable printing sleeve comprising:
a) a sleeve carrier;
b) at least one collapsible curable layer disposed on said sleeve carrier, said at least one collapsible curable layer comprising: (i) a curable elastomer, (ii) a material that absorbs laser light at a selected wavelength, and (iii) microspheres; and
c) a cap layer disposed on said at least one collapsible curable layer, said cap layer comprising a non-collapsible curable elastomer;
wherein the printing sleeve comprises a relief image formed from selectively collapsed and melted portions of the at least one collapsible curable layer; and
wherein the printing sleeve is cured to cross-link and cure said relief image.

80. The digitally imageable printing sleeve of claim 79, wherein said selected collapsed and melted portions of the at least one collapsible curable layer are produced by an infrared laser.

81. The digitally imageable printing sleeve of claim 79, wherein the microspheres are selected from the group consisting of expanded microspheres and unexpanded microspheres.

82. The digitally imageable printing sleeve of claim 79, wherein the at least one collapsible curable layer comprises about 5% to about 15%, by weight, of the microspheres.

83. The digitally imageable printing sleeve of claim 79, wherein the at least one collapsible radiation-curable layer comprises about 0.01 to about 5 percent, by weight, of the material that absorbs laser light at the selected wavelength.

84. The digitally imageable printing sleeve of claim 79, wherein said sleeve carrier is selected from the group consisting of metals, polymeric films, and polymer/fiber composites.

85. The digitally imageable printing sleeve of claim 80, wherein said material that absorbs laser light at the selected wavelength is a infrared dye or pigment that is selected based on the operating wavelength of said laser.

86. The digitally imageable printing sleeve of claim 85, wherein the infrared dye or pigment is UV-transmissive at wavelengths between 350 and 400 nanometers.

87. The digitally imageable printing sleeve of claim 79, wherein the IR-laser uses different energy densities to create areas of different depths on the relief image.

88. The digitally imageable printing sleeve of claim 79, wherein said printing sleeve is further post cured and detacked.

89. A method of making a digitally imaged relief-printing element comprising the steps of:
a) providing a collapsible curable layer on a substrate, said collapsible curable layer comprising (i) a curable elastomer, (ii) a material that absorbs laser light at a selected wavelength, and (iii) microspheres;
b) exposing the collapsible curable layer to establish a floor layer;
c) using a laser to collapse and melt portions of the collapsible curable layer to form a relief image on the printing plate; and
d) curing said curable layer by face exposure to crosslink and cure said formed relief image.

90. A method according to claim 89, wherein the substrate is flat or cylindrical.

91. A method according to claim 89, wherein said curable layer is cured by exposure to UV radiation.

92. A method according to claim 89, wherein as the relief image is formed on the printing element, the printing element is simultaneously bump-exposed, to collapse at least a portion of said collapsible curable layer to create a final printing surface on said printing element.

93. A method according to claim 89, further comprising a step of laser collapsing at least a portion of said formed image to form a denser printing surface.

94. A method according to claim 89, wherein the curable elastomer of the collapsible curable layer comprises a binder, a plasticizer, one or more curable monomers, and a photoinitiator.

95. A method according to claim 94, wherein said one or more curable monomers are curable by UV-light.

96. A method according to claim 89, wherein the collapsible curable elastomer layer comprises about 0.01 to about 5 percent, by weight, of the material that absorbs laser light at the selected wavelength.

97. A method according to claim 89, wherein said laser is a plate setter infrared laser operating at a wavelength of 830 nanometers or 1064 nanometers.

98. A method according to claim 97, wherein said material that absorbs laser light at the selected wavelength is selected based on the operating wavelength of the plate-setter laser.

99. A method according to claim 96, wherein the material that absorbs laser light at the selected wavelength is an infrared dye or pigment.

100. A method according to claim 99, wherein the infrared dye or pigment is UV-transmissive at wavelengths between 350 and 400 nanometers.

101. A method according to claim 89, wherein the laser is an IR-laser that uses different energy densities to create areas of different depths on the relief image.

102. A digitally imaged relief-printing element comprising:
- a collapsible curable layer comprising: (i) a curable elastomer, (ii) a material that absorbs laser light at the selected wavelength, and (iii) microspheres, on a substrate;
- wherein the printing element comprises a relief image formed from selectively collapsed and melted portions of the collapsible curable layer; and
- wherein the printing element is cured to cross link and cure said relief image.

103. A printing element according to claim 102, wherein the substrate is flat or cylindrical.

104. A printing element according to claim 102, wherein said curable layer is cured by exposure to UV radiation.

105. A printing element according to claim 102, further comprising a collapsed top layer of the collapsible curable layer that creates a denser printing surface.

106. A printing element according to claim 102, wherein an IR-laser is used to produce said selected collapsed and melted portions of the collapsible curable layer.

107. A printing element according to claim 102, wherein the curable elastomer of the collapsible curable layer comprises a binder, a plasticizer, one or more curable monomers, and a photoinitiator.

108. A printing element according to claim 107, wherein said one or more curable monomers are curable by UV-light.

109. A printing element according to claim 102, wherein the collapsible curable elastomer layer comprises about 5% to about 15%, by weight, of the microspheres.

110. A printing element according to claim 102, wherein the collapsible curable layer comprises about 0.01 to about 5 percent, by weight, of the material that absorbs laser light at the selected wavelength.

111. A printing element according to claim 110, wherein said material that absorbs laser light at the selected wavelength is an infrared dye or pigment that is selected based on the operating wavelength of the IR-laser.

112. A printing element according to claim 111, wherein the infrared dye or pigment is UV-transmissive at wavelengths between 350 and 400 nanometers.

113. A printing element according to claim 112, wherein the IR-laser uses different energy densities to create areas of different depths on the relief image.

* * * * *

UNITED STATES PATENT AND TRADEMARK OFFICE
CERTIFICATE OF CORRECTION

PATENT NO. : 6,989,220 B2  
DATED : January 24, 2006  
INVENTOR(S) : Rustom Sam Kanga It is certified that error appears in the above-identified patent and that said Letters Patent is hereby corrected as shown below:

<u>Column 23,</u>  
Line 16, delete "e) removing" and replace it with -- c) removing --.  
Line 42, delete "mare" and replace it with -- more --.

<u>Column 25,</u>  
Line 26, delete "tumble" and replace it with -- curable --.

<u>Column 27,</u>  
Line 12, delete "stop" and replace it with -- step --.

Signed and Sealed this

Eighteenth Day of April, 2006

JON W. DUDAS  
*Director of the United States Patent and Trademark Office*